United States Patent
Aslan et al.

[19]

[11] Patent Number: 6,149,299

[45] Date of Patent: *Nov. 21, 2000

[54] DIRECT TEMPERATURE SENSING OF A SEMICONDUCTOR DEVICE SEMICONDUCTOR DEVICE

[75] Inventors: Mehmet Aslan, Sunnyvale; Sümer Can, Cupertino, both of Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/988,874

[22] Filed: Dec. 11, 1997

[51] Int. Cl.$^7$ .......................... G01K 7/00; H01L 31/058; H01L 35/00; H03K 17/78

[52] U.S. Cl. .......................... 374/178; 257/470; 327/512

[58] Field of Search ...................................... 378/163, 172, 378/173, 178; 257/467–470; 327/512

[56] References Cited

U.S. PATENT DOCUMENTS

| | | | |
|---|---|---|---|
| 5,100,829 | 3/1992 | Fay et al. | 437/60 |
| 5,195,827 | 3/1993 | Audy et al. | |
| 5,349,336 | 9/1994 | Nishiura et al. | 374/178 |
| 5,401,099 | 3/1995 | Nishizawa et al. | 374/178 |

FOREIGN PATENT DOCUMENTS

| | | | |
|---|---|---|---|
| 61-792234 | 5/1986 | Japan | G01K 7/00 |
| 2-83436 | 6/1990 | Japan | G01K 7/00 |
| 9-229778 | 9/1997 | Japan | G01K 7/01 |

OTHER PUBLICATIONS

Tektronix, Inc., Tektronix Products 1973; New Product Summary, p. 67.

*Primary Examiner*—Vit Miska
*Attorney, Agent, or Firm*—Limbach & Limbach L.L.P.

[57] ABSTRACT

An apparatus and method for directly measuring the operating temperature of a semiconductor device. A temperature sensor is placed directly on the substrate containing the device whose temperature is of interest. The circuitry used to process the sensor signals is on a separate substrate. Because the sensor is on the same substrate as the device of interest, noise is produced in the sensor signals as a result of electrons injected into the substrate by the device. The present invention includes methods for cancelling the noise and error in the temperature measurements to provide a very accurate determination of the device's operating temperature.

16 Claims, 7 Drawing Sheets

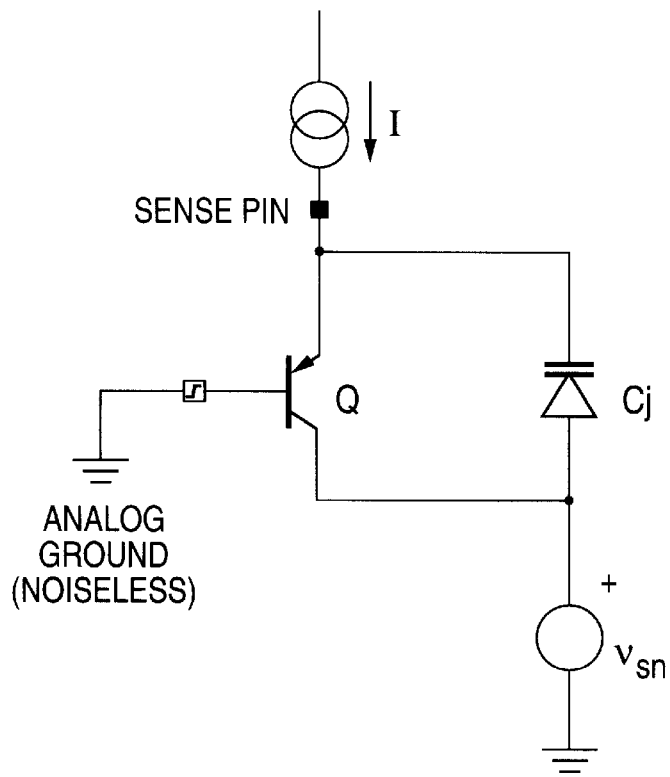
FIG. 8
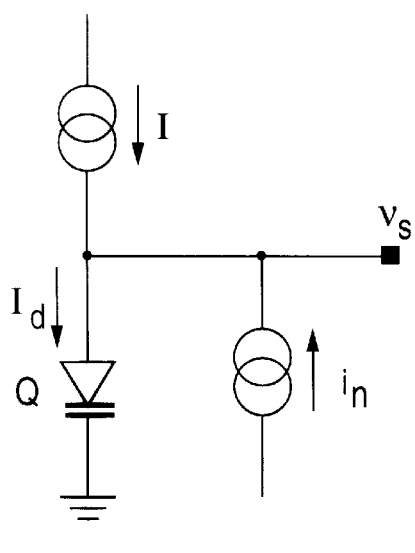 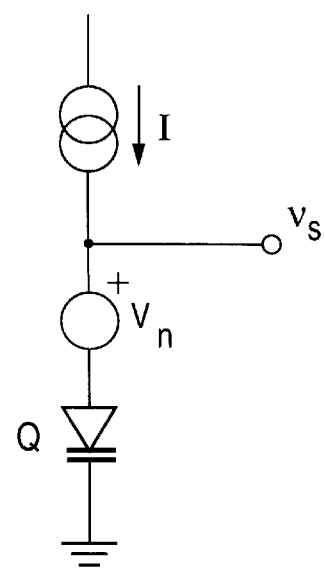
FIG. 9          FIG. 10

DIRECT TEMPERATURE SENSING OF A SEMICONDUCTOR DEVICE SEMICONDUCTOR DEVICE

TECHNICAL FIELD

The present invention is directed to apparatus and methods for sensing the temperature of a semiconductor device, and more specifically, to an apparatus and method for more accurately sensing the temperature of an integrated circuit chip by placing a temperature sensor directly on the chip. The circuitry needed to process the sensor's signals and determine the chip temperature is located on a separate substrate. Noise modeling and error cancellation methods for use in processing the received signals to determine the device temperature are also described as part of the invention.

BACKGROUND OF THE INVENTION

Temperature sensors are used in the semiconductor industry to monitor the operating temperatures of devices fabricated on integrated circuit chips. Typically, the actual sensor and the associated sensing circuitry are fabricated on a separate chip from that which contains the device whose temperature is being monitored. The sensor chip is then placed close to the chip containing the device of interest. This means that in reality, the temperature sensor is measuring the temperature of the local environment of the device, not its actual temperature.

Semiconductor junction diodes are often used as temperature sensors for integrated circuit devices. Such a diode sensor is shown in FIG. 1. When such a diode is biased at a given current and the junction temperature varies, the voltage across the diode shows an almost linear variation with temperature. The diode voltage versus temperature curve has a negative coefficient, with the diode voltage equal to the bandgap voltage of silicon at zero absolute temperature (0° Kelvin). The relationship between $V_d(Tr)$, the diode voltage at a reference temperature Tr, and $V_d(T)$, the diode voltage at a temperature T can be modeled as:

$$V_d(T) \approx V_{bg} - [V_{bg} - V_d(Tr)]\frac{T}{Tr} \quad (1)$$

This is a linearized diode equation representing the $V_d$ versus T relation. In the equation, $V_{bg}$ is the silicon bandgap voltage of the diode. As is evident, measurements of the diode voltage can be used directly for temperature sensing. However, the $V_d$ versus T relationship has a curvature (non-linearity) of the temperature-to-forward voltage transfer function which is on the order of a couple of percent over the normal silicon operating temperature range. Such sensors also show variation from process to process and across the silicon wafer (i.e., sensor-to-sensor). The junction diodes thus require calibration and introduce errors when used as a temperature sensor.

The diode forward voltage as a function of temperature may also be expressed in terms of the current source, ($I_F$), and the reverse saturation current ($I_S$) In this case the diode voltage ($V_F$) is expressed as:

$$V_F = (kT/q) \ln (I_F/I_S), \quad (2)$$

where k is Boltzmann's constant and q is the electron charge.

As noted, using a single diode as a temperature sensor has the disadvantage that the measurements are subject to process variation and non-linearity problems. For this reason a differential, two sensor measurement technique is sometimes used.

A differential technique is based on measuring the difference in the forward voltages of two junctions operating at different current densities. FIG. 2 is a schematic showing how two junction diode temperature sensors may be used as part of a differential temperature measurement technique. Different current densities can be achieved with various combinations of diode areas and currents. A typical approach might be to give diodes D1 and D2 equal collector currents, but different areas (for example, D2 might be ten times the size of D1). The difference between their forward voltages will then be proportional to the log of the current density ratio and to absolute temperature, as can be seen in the following equation:

$$V_{F1} - V_{F2} = (kT/q) \ln (J_1/J_2). \quad (3)$$

In the equation, $J_1$ and $J_2$ are the current densities (current per unit area) in D1 and D2.

The differential output voltage is a fairly small voltage (typically only a fraction of a millivolt/K), so it is amplified to create a more convenient temperature coefficient (such as 10 mV/K) at the processing circuitry output. This technique is used to produce silicon temperature sensors with output voltages or currents proportional to absolute temperature.

FIG. 3 is a diagram showing a temperature sensor 100 formed from a junction diode 102 which may be used to sense the temperature of an integrated circuit. Junction diode 102 is characterized by its junction temperature, $T_j$. The junction is formed from a p-type region which is introduced into an n-type substrate. Diode 102 is typically mounted on a metal frame 104 which, along with encapsulating material 106, serves as the case for sensor 100. The case is characterized by a case temperature, $T_c$. As noted, when measuring the temperature of a device, sensor 100 is placed in close proximity to the device of interest, separated by a region characterized by an ambient temperature, $T_A$.

For sensor 100 of FIG. 3, $T_j$ and $T_A$ are related by:

$$T_j - T_A = \theta_{jA} * P_j,$$

where $\theta_{jA}$ is the thermal resistance between the junction of the diode and the ambient environment, and $P_j$ is the power dissipated at the junction. If the power dissipated at the junction is small, then $$T_j - T_A \approx 0, \text{ which implies } T_j \approx T_A.$$

Thus, in this situation, the ambient temperature is very close to the junction temperature. This means that the junction temperature can be used as a reasonably good approximation to the ambient temperature. Thus, a junction diode with very small power dissipation can be used to accurately sense the temperature of an ambient environment. Note that this does not address the issue of whether the ambient temperature is an accurate indication of the temperature of a semiconductor device in the ambient region.

As recognized by the inventors of the present invention, the conventional temperature sensing method described with reference to FIGS. 1–3 may not be satisfactory for modern integrated circuits. As devices with higher clock speeds are developed, the accuracy with which the temperature of a device can be determined becomes more important. This is because such devices typically generate more heat than lower clock speed devices. It is important to closely monitor the heat generated, and hence the temperature, to prevent device failures. Thus, knowing the actual device temperature during operation provides assistance in assessing the reliability and performance of a device.

FIG. 4 is a diagram showing how the temperature sensor of FIG. 3 is typically used to sense the temperature of an integrated circuit chip, or of a device formed on the chip. In the Figure, $IC_1$ is the integrated circuit for which the temperature is to be measured. Integrated circuit $IC_1$ is shown mounted on a printed circuit board. An example of such a circuit would be a microprocessor. $IC_2$ is integrated circuit temperature sensor 100 of FIG. 3 which is used to measure the ambient temperature of the space underneath $IC_1$. Since $$T_{j2}-T_A=\theta_{j2A}P_{j2},$$

and $P_{j2}$ is very small, $T_{j2} \approx T_A$. However, $P_{j1}$ (the power dissipation of $IC_1$) is not necessarily small. In addition, its value is also time dependent. Given the relationship $$T_{j1}-T_A=\theta_{j1A}P_{j1},$$

it is apparent that measuring only the value of $T_A$ is insufficient to determine the temperature of $IC_1$ (i.e., $T_{j1}$). It is also necessary to know the values of $\theta_{j1A}$ and $P_{j1}$. $\theta_{j1A}$ may be separately measured and determined for a specific package containing $IC_1$. However, $P_{j1}$ is not a constant and is dependent upon the operating status of $IC_1$.

During the operation of currently available high speed integrated circuits, $P_{j1}$ can change from a very small value (e.g., in the idle mode) to very large values at full speed operation. This is particularly true for microprocessors running at clock speeds of hundreds of MHz. Since the power dissipation in integrated circuits is directly proportional to the clock speed, the value of $P_{j1}$ is a term which cannot be reliably estimated or overlooked. This means that the conventional, remote temperature sensing method cannot, in many instances, be used to accurately determine the temperature of high speed devices.

What is desired is an apparatus and method for accurately determining the actual operating temperature of a semiconductor device.

SUMMARY OF THE INVENTION

The present invention is directed to an apparatus and method for directly measuring the operating temperature of a semiconductor device. A temperature sensor is placed directly on the substrate containing the device whose temperature is of interest. The circuitry used to process the sensor signals is on a separate substrate. Because the sensor is on the same substrate as the device of interest, noise is produced in the sensor signals as a result of electrons injected into the substrate by the device. The present invention includes methods for cancelling the noise and error in the temperature measurements to provide a very accurate determination of the device's operating temperature.

Further objects and advantages of the present invention will become apparent from the following detailed description and accompanying drawings.

BRIEF DESCRIPTION OF THE DRAWINGS

FIGS. 8–10 are schematic diagrams of a model of the substrate injected noise for a substrate containing a temperature sensing junction.

DETAILED DESCRIPTION OF THE INVENTION

The inventors of the present invention have recognized that a more accurate measurement of the operating temperature of a device of interest may be obtained by placing a temperature sensor directly on the substrate containing the device. The associated circuitry for generating and processing the sensor signals is located on a second substrate. This places the sensor in closer proximity to the device whose temperature is of interest, providing a more accurate measurement of the temperature. The inventors also recognized that this arrangement of the sensor could lead to an increase in the noise component of the sensor signals due to electrons injected by the device of interest into the common substrate of the sensor and device. This noise problem is addressed by inventive techniques for modeling and cancelling the noise.

The temperature sensor used in the embodiments of the present invention is typically a p-n junction of a bipolar junction transistor or CMOS device. The relationship between the current flowing through the junction (I), the voltage across the junction ($V_D$), and the temperature of the junction (T) is given by:

$$V_D = V_T \ln (I/I_S), \qquad (4)$$

where $V_T = k \cdot T/q$ and k is Boltzmann's constant, q is the electron charge, and $I_S$ is a process related parameter which is proportional to the junction area.

Figure 1:
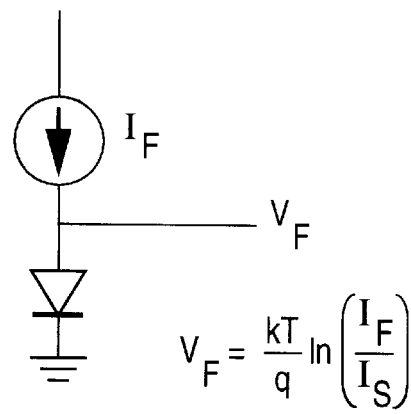
FIG. 1 shows a schematic of junction diode used as a temperature sensor.
Figure 2:
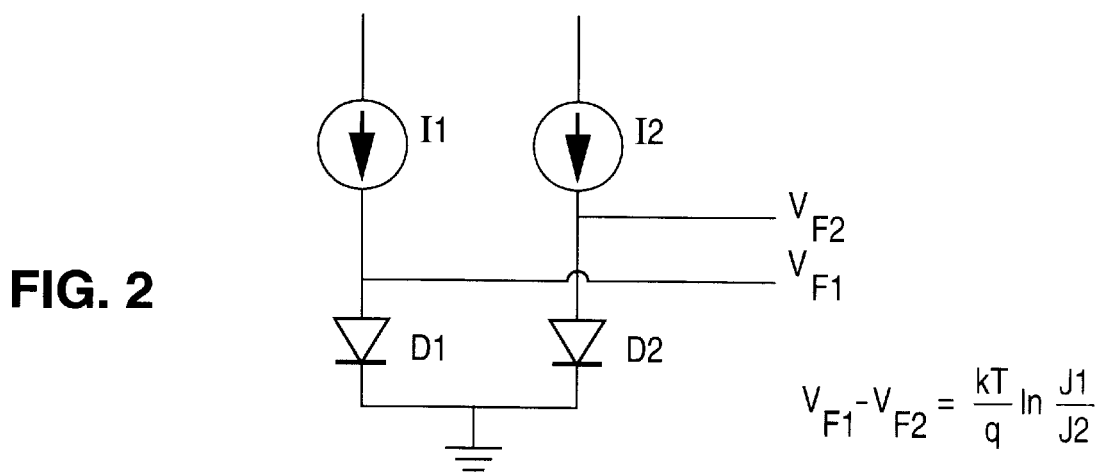
FIG. 2 is a schematic showing how two junction diode temperature sensors may be used as part of a differential temperature measurement technique.
Figure 3:
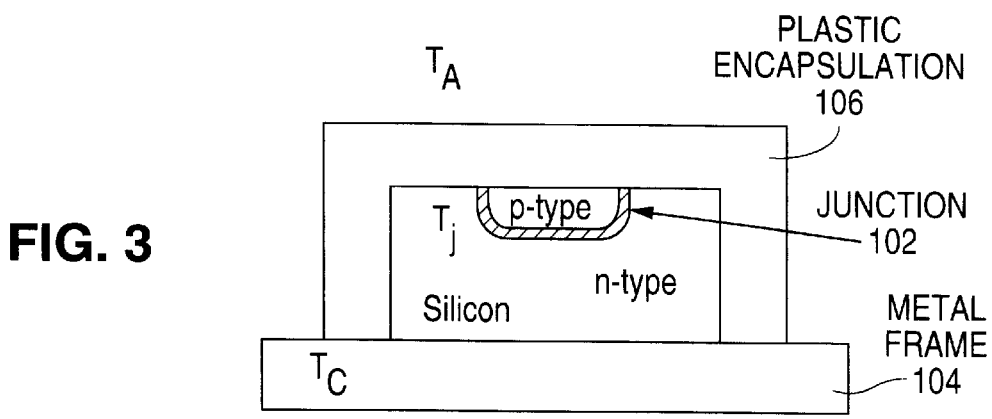
FIG. 3 is a diagram showing a temperature sensor formed from a junction diode which may be used to sense the temperature of an integrated circuit.
Figure 4:
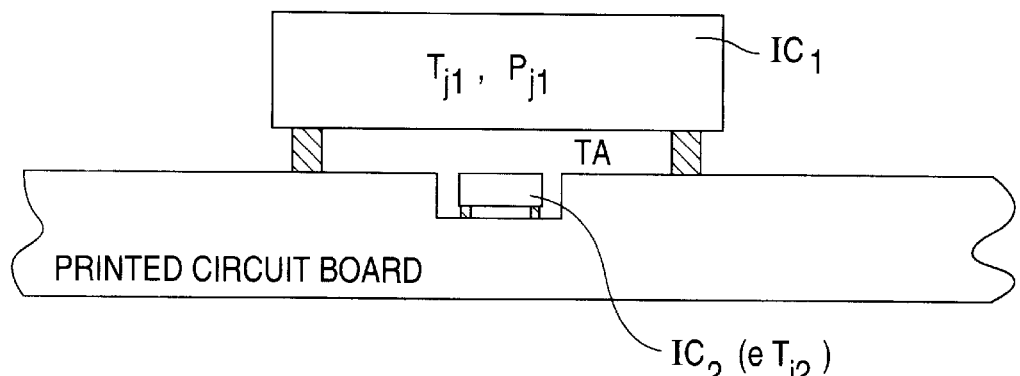
FIG. 4 is a diagram showing how the sensor of FIG. 3 is typically used to sense the temperature of an integrated circuit chip.
Figure 5:
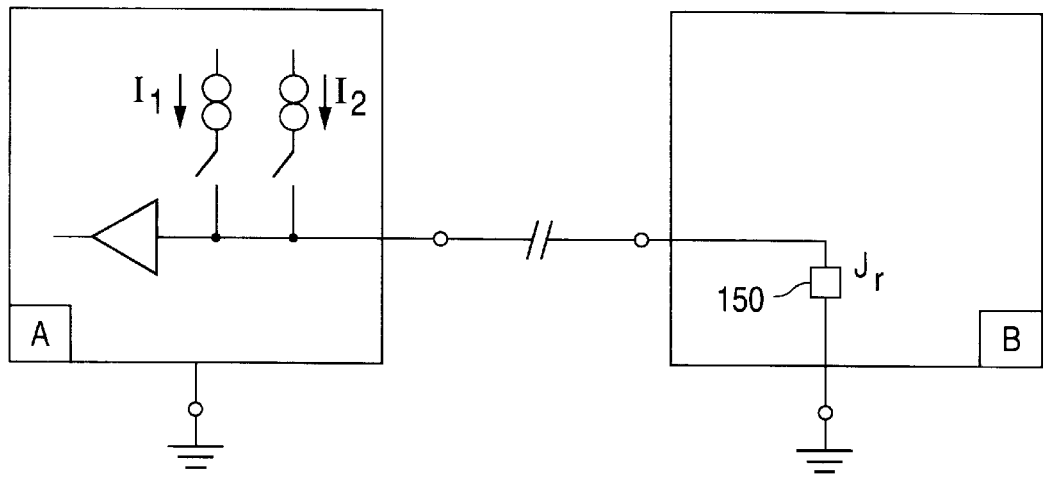
FIG. 5 is a block diagram of a first embodiment of the present invention for directly measuring the temperature of a separate body.

FIG. 5 is a block diagram of a first embodiment of the present invention for directly measuring the temperature of a separate body. The embodiment shown in FIG. 5 is termed a "single-ended" sensing mode because only a single sensing junction (denoted as element 150 in the FIG.) is placed on the substrate containing the device of interest (labelled substrate "B" in the FIG.).

A temperature measurement is performed using the device of FIG. 5 by pushing a first current, $I_1$, through junction $J_1$ 150 at time $t_1$, followed by pushing a second current, $I_2$, through junction $J_1$ 150 at time $t_2$. The difference in the junction voltages at times $t_1$ and $t_2$ is then determined and used to infer the junction temperature.

Figure 6:
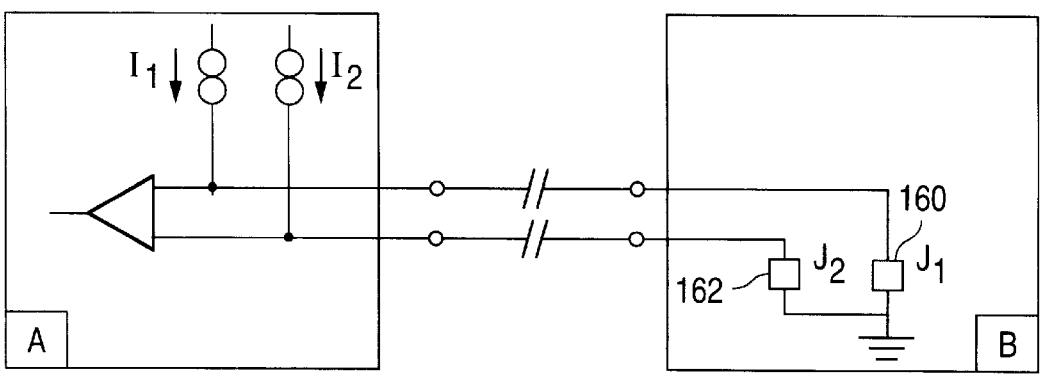
FIG. 6 is a block diagram of a second embodiment of the present invention for directly measuring the temperature of a separate body.

FIG. 6 is a block diagram of a second embodiment of the present invention for directly measuring the temperature of a separate body. The embodiment shown in FIG. 6 is termed a "differential" sensing mode because two sensing junctions (elements 160 and 162 in the figure) are placed on the substrate containing the device of interest (labelled substrate "B" in the figure), and the difference between the junction voltages is used to indicate the temperature. A temperature measurement is performed using the device of FIG. 6 by pushing a first current, $I_1$, through junction $J_1$ 160 and a second current, $I_2$, through junction $J_2$ 162 at the same time.

By placing the sensing junctions (which may be nothing more than a diode) on substrate B and preferably inside the device whose temperature is to be measured, the sensing device $IC_2$ (contained on the substrate labelled "A" in the figure) can directly measure the junction temperature of $IC_1$ (contained on the substrate labelled "B" in the figure). The sensed data processed by $IC_2$ can be communicated back to $IC_1$ through a "data communication line", which may be a serial bus where data is transmitted as a series of pulses, digitally. This information can then be used by the device on $IC_1$ to control its operation or to initiate some type of error signal.

In the temperature measuring schemes described, there are two main issues which need to be addressed:

1. $IC_2$ should process the temperature sensor information fast enough and transmit it to $IC_1$ in a timely manner before the temperature in $IC_1$ increases to critical levels; and
2. $IC_2$ should sense the temperature of $IC_1$ accurately. If the sensor information, which is usually the diode voltage(s), are polluted by noise the temperature sensing will be inaccurate. Since the sense diodes are located in a high speed VLSI (manufactured using CMOS technology), it is very likely that diode voltages will be polluted by substrate injected noise.

In addition, while both single-ended and differential sensing schemes are capable of providing the required data, a differential scheme is preferred for the following reasons:

1. A single-ended scheme requires two clock cycles to complete acquisition of the data. One clock cycle is sufficient when using a differential scheme;
2. A single-ended scheme requires a data storage capability;
3. When using a differential scheme, the voltage difference can be directly sampled using a capacitor. This makes the sensed signals more immune to ground noise; and
4. When using a differential scheme, the junction areas do not have to be equal. This provides a more accurate reading compared to the single-ended case for the same current ratio.

Owing to the significance of the noise issue, the inventors developed a model for the substrate injected noise. They also developed methods for eliminating or reducing the noise using innovative temperature sensing schemes. Thus, the inventors have presented a way to model substrate noise and proposed several configurations which eliminate the noise contribution from the temperature measurement. The inventors have examined the noise problem for both single diode and two diode sensing techniques.

In addition to the noise issue, the speed with which a measurement can be made is an important performance criteria. In certain applications, the device temperature may increase very quickly. A user of the inventive measurement technique needs to be able to sense and process the information about temperature reasonably fast, and accurately.

In a single diode approach to temperature sensing, diode voltage is measured in two sequential time intervals for two different current densities. Therefore, temperature-to-digital serial data conversion is two times slower than the two diode approach where each diode is operated with two different current densities and the diode voltage difference is measured during a single time interval.

Another advantage of two diode approach is that the noise injection to each diode pin can largely be cancelled out using differential measurement techniques. In the present application, the inventors have proposed configurations for both single and dual diode approaches in order to cover a wider range of applications.

Modeling of Substrate Injected Noise

As noted, the inventors have developed a model of the noise injected into a substrate on which is fabricated a temperature sensing junction by other devices on the same substrate. This is a problem specific to the inventive design, and does not occur when the temperature sensor is placed on a different substrate than the device whose temperature is being sensed.

In the following discussion of substrate injected noise modeling for temperature sensing junctions, only n-well CMOS technology is considered. One of ordinary skill will recognize that the same concept is applicable for p-well CMOS and bipolar technologies.

Figure 7:
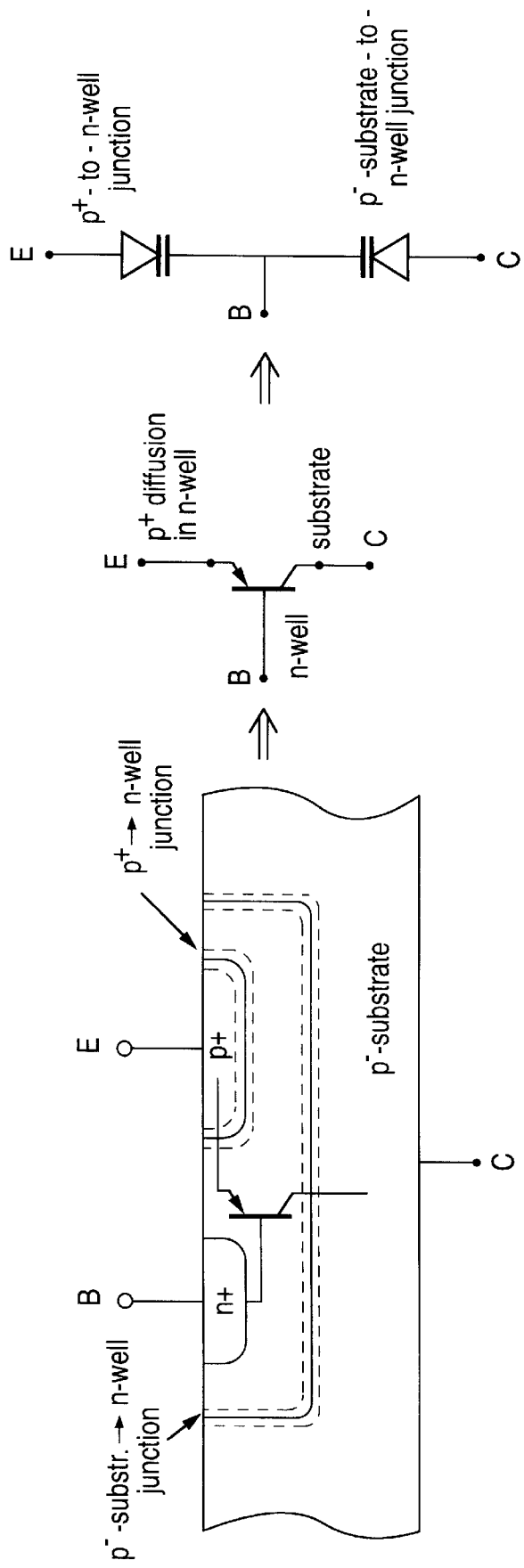
FIG. 7 is a side view showing the structure of a substrate transistor which is used as a temperature sensing device.

The substrate pnp transistor, which is naturally formed in n-well CMOS technology, is used as the temperature sensing device. The substrate pnp structure is formed by a heavily doped $p^+$ diffusion inside a lightly doped n-well and the lightly doped p-substrate, as shown in FIG. 7, which is a side view showing the structure of a substrate transistor which is used as a temperature sensing device. As shown in the figure, $p^+$ diffusion region and n-well forms the emitter-base junction and the p-substrate-to-n-well forms the collector-base junction of the substrate pnp transistor. The n-well and the p-substrate are the places where p-channel and n-channel MOS transistors are built using n-well CMOS technology. When such a structure shares the same p-substrate with a digital CMOS VLSI, the p-substrate becomes very noisy due to the charges dumped to the substrate from switching MOS transistors. The noise charge can be injected into the n-well by the p-substrate to n-well junction depletion capacitance. Some of these charges will be collected by the emitter through the n-well-$p^+$ junction, even if the n-well (base) grounded. However, this source of noise charge injection is expected to be small. Typically, it is expected that a more significant source of noise charge injection is the direct access to the emitter terminal of the sense junction due to the ESD (Electro-Static Discharge) protection structure at this terminal. The noise charge injection is expected to be significant when either of the two most common ESD structures, the NMOS clamp type or the diode clamp type, are used.

Based on the substrate noise injection discussions in the previous section, the noise contribution to the sensed signal can be modeled. FIGS. 8–10 are schematic diagrams of a model of the substrate injected noise for a substrate containing a temperature sensing junction. In FIG. 8, the temperature sensing pnp device is represented by Q, the random noise in the digital substrate is presented by a voltage source $V_{sn}$, and the junction capacitance which injects the noise to the sense pin is represented by $C_j$, where $C_j$ is a voltage dependent junction capacitor.

The noise charge ($Q_n$) injected to the sense pin is given by;

$$Q_n = C_j * V_{sn}.$$

From the equation, the noise current at the sense pin can be expressed as:

$$i_n = dQ_n/dt = C_j dV_{sn}/dt + V_{sn} \partial Q_n / \partial V_{sn} * dV_{sn}/dt.$$

Assuming a weak dependence of $C_j$ on $V_{sn}$, the equation can be rewritten as;

$$i_n = C_j dV_{sn}/dt + C^*_j dV_{sn}/dt,$$

where $C_j$ and $C^*_j$ are generally nonlinear (voltage dependent) capacitances. This equation can be linearized for small signal modeling purposes. For large signal modeling, a general expression which can be used is:

$$i_n = \hat{C}_j(V_{sn}) dv_{sn}/dt = i_n(V_{sn}).$$

The substrate injected noise model representation of the circuit shown in FIG. 8 can be simplified and redrawn as shown in FIG. 9. From the figure, an equivalent substrate injected voltage noise can be derived. The current flowing through the diode ($I_d$) is given by:

$$I_d = I + i_n.$$

Substituting $I_d$ in the well known diode equation gives:

$$V_s = V_T \ln[(I+i_n)/I_s)],$$

where $V_T = kT/q$ is the thermal voltage (k is again the Boltzmann constant, q is the electronic charge, and T is the absolute temperature). $I_n$ (shown as $i_n$ in the equation) is the substrate injected noise current, $I_s$ is the diode's saturation current and I is the bias current. The equation for $v_s$ can be manipulated and rewritten as given below;

$$V_s = V_T \ln[I/I_s(1+i_n/I_s)] =$$

$$V_T \ln I/I_s + V_T \ln(1+i_n/I_s).$$

Since, $i_n/I \ll 1$ (by selecting a large enough bias current), and in $[1+i_n/I] \approx i_n/I$, the equation can be rewritten as:

$$V_s \approx V_T \ln(I/I_s) + V_T(i_n/I).$$

The first term can be substituted with the term for the noiseless diode voltage, $V_d$, and the second term can be renamed as $e_n$ to obtain $$V_s = V_d + e_n,$$

where $e_n$ is the equivalent substrate injected noise voltage at the sense pin. The new equivalent noise circuit is shown in FIG. 10.

Implementations of the Invention

In the first section of this document, general techniques for sensing the temperature of a separate semiconductor body were discussed. In the next section, the effects and the mechanism of substrate injected noise on a temperature sensing junction were discussed. A model for the substrate injected noise was also presented.

In the following section, the general temperature sensing problem is re-visited and four temperature sensing configurations which eliminate the effects of substrate injected noise are presented. In this section, two techniques for temperature sensing in a noisy VLSI circuit are examined. The first method utilizes a single junction diode operating at two different bias currents to obtain different current densities. The second method utilizes two junction diodes, where two different current densities are achieved either by having different size diode pairs or different magnitude bias currents.

Single Junction Diode Temperature Sensor for a Noisy VLSI Chip

Figure 11:
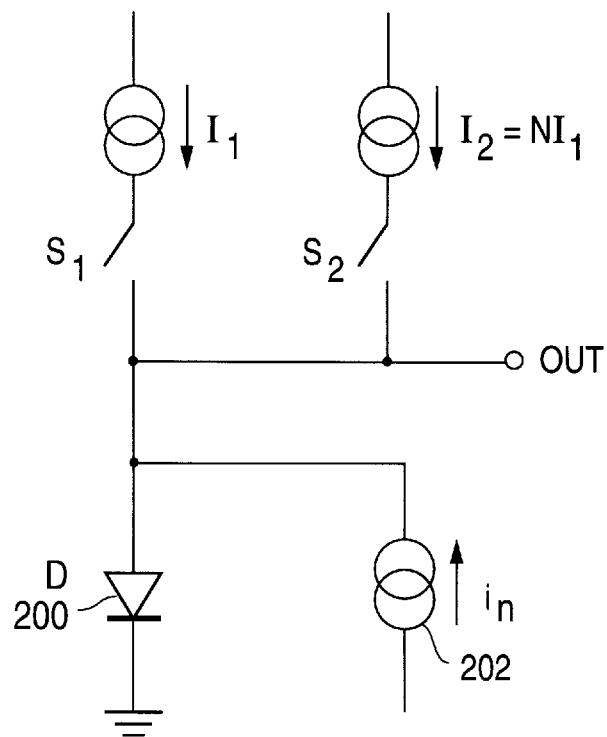
FIG. 11 is a diagram showing a single junction diode and its associated current noise term when used to implement the direct temperature measuring method of the present invention.

FIG. 11 is a diagram showing a single junction diode 200 and its associated current noise 202 when used to implement the direct temperature measuring method of the present invention. Two different levels of bias currents (labelled $I_1$ and $I_2$ in the figure) are sequentially applied using switches $S_1$ and $S_2$. Note that $I_2$ is an integer multiple of $I_1$.

During the time interval $\Delta t_1$, switch $S_1$ is closed and switch $S_2$ is opened. The voltage at the output node (Out) is expressed as:

$$V_{o1} = V_T \ln \frac{I_1 + i_n}{I_S} \qquad (5)$$

where $V_T$ is the thermal voltage and $I_s$ is the saturation current of diode 200. During the following time interval $\Delta t_2$ switch $S_1$ is opened and switch $S_2$ is closed. The output voltage for this interval is given by;

$$V_{o2} = V_T \ln \frac{NI_1 + i_n}{I_S} \qquad (6)$$

where N is a constant (the ratio of $I_2$ to $I_1$).

If the voltages $V_{O1}$ and $V_{O2}$ are stored at time intervals $\Delta t_1$ and $\Delta t_2$, and subtracted from each other by the appropriate signal processing circuitry, a voltage difference $\Delta V_o$ is obtained and given by;

$$\Delta V_o = V_{o2} - V_{o1} = V_T \ln \frac{NI_1 + i_n}{I_1 + i_n} \qquad (7)$$

After some manipulations and the fact that $i_n \ll I_1$, the following equation is obtained;

$$\Delta V_o \approx V_T \left( \ln N + \frac{i_n}{I} \right) = V_T \ln N + en \qquad (8)$$

The thermal voltage $V_T$ in equation (8) is given by;

$$V_T = \frac{k T_o}{q} \frac{T}{T_o} \qquad (9)$$

where k is Boltzmann's constant, q is the electronic charge, $T_o$ is the reference temperature (300° K.) and T is the temperature to be measured.

Substituting equation (9) into equation (8), an expression for the normalized temperature $T/T_o$ can be derived. In equation (10), $\Delta V_o$ is the electronically calculated (by two sequential measurements) voltage difference, $V_{To}$ is the thermal voltage at reference temperature $T_o$, and the error term (en) is the equivalent noise voltage which appears as a temperature sensing error.

$$\frac{T}{T_o} = \frac{\Delta V_o}{V_{T_o} \ln N + en} \qquad (10)$$

Thus, by performing two sequential measurements, the temperature can be measured within an error factor, en. This error can be eliminated if further measurements are performed.

In order to eliminate the error term, two separate measurement sequences may be used to determine the value of the noise voltage (this is effectively a calibration sequence).

Once en is determined during the sequence of measurements, it can be eliminated. The ratio $T/T_o$ will then be given by:

$$\frac{T}{T_o} = 1 + \frac{\Delta V_o - \Delta V_{o_{initial}}}{V_{T_o} \ln N} \quad (11)$$

Note that this method requires longer storage (conversion time) and introduces additional complication in the processing circuitry.

Two Junction Diode Temperature Sensor for a Noisy VLSI Chip

Figure 12:
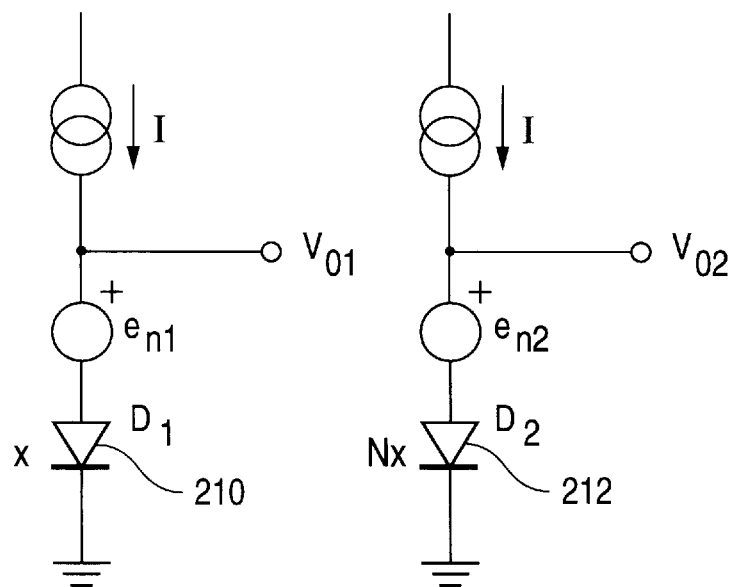
FIG. 12 is a diagram showing two junction diodes with the associated current noise terms when used to implement the direct temperature measuring method of the present invention.

FIG. 12 is a diagram showing two junction diodes with the associated current noise terms when used to implement the direct temperature measuring method of the present invention. Two junction diodes (elements 210 and 212 in the figure) with areas x and Nx, respectively, are shown together with their associated equivalent voltage errors en and en2. The bias currents flowing through each diode are both equal to I. The output voltages $V_{o1}$ and $V_{o2}$ can be simultaneously measured and subtracted from each other by a signal processing circuit. The voltages $V_{o1}$ and $V_{o2}$ are given by;

$$V_{o1} = V_T \ln \frac{I}{I_s} + en_1 \quad (12)$$

$$V_{o2} = V_T \ln \frac{I}{NI_s} + en_2 \quad (13)$$

From (12) and (13):

$$\Delta V_o = V_{o1} - V_{o2} = V_T \ln N + en_1 - en_2 \quad (14)$$

Since the areas of the two diodes are different and the area of D1 is N times larger than D1, generally en1>en2. Let, $$en_1 - en_2 = \Delta en \quad (15)$$

Substituting equation (15) in equation (14):

$$\frac{T}{T_o} = \frac{\Delta V_o + \Delta en}{V_{T_o} \ln N} \quad (16)$$

As can be seen from equation (16), the sensed temperature term includes an error $\Delta en$ introduced by the substrate injected noise.

Techniques for Temperature Sensing of a Noisy VLSI Circuit

In this section, four techniques for temperature sensing in the environment of a noisy VLSI circuit are described. FIGS. 13–16 are schematic diagrams showing the measurement set-up for four methods of implementing the temperature sensing method of the present invention in the environment of a noisy circuit. In these temperature sensing schemes, two different current densities are obtained by using different diode areas or by different current magnitudes. Noise cancellation is accomplished by cross-connected configurations and sequential measurement techniques.

1. Ratioed Area/Ratioed Bias Configuration

Figure 13:
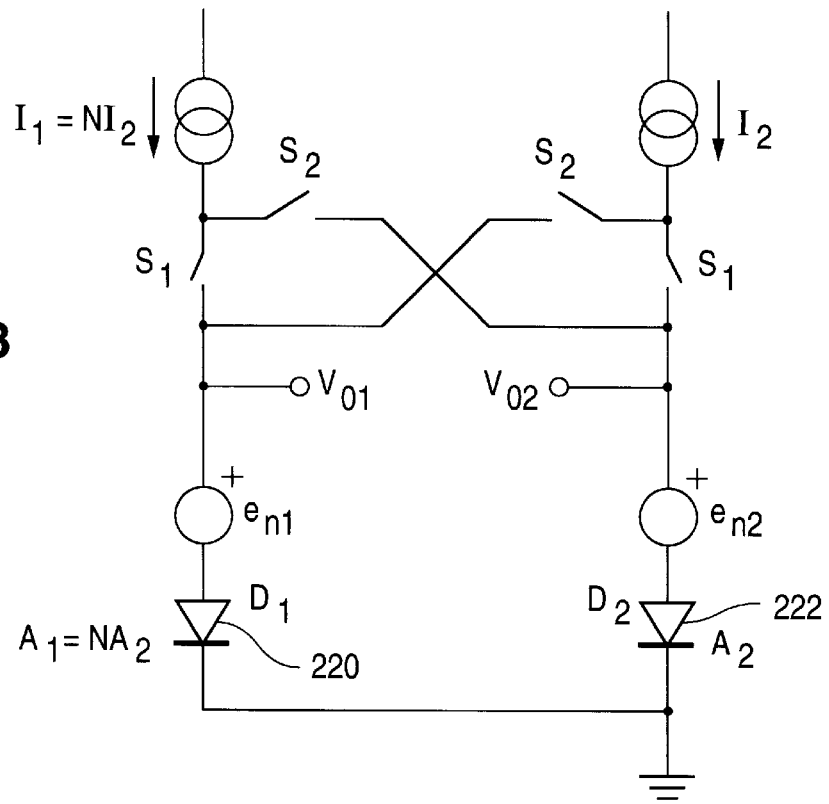
FIGS. 13–16 are schematic diagrams showing the measurement set-up for four methods of implementing the temperature sensing method of the present invention in the environment of a noisy circuit.

The Ratioed Area/Ratioed Bias configuration is shown in FIG. 13. Note that diode $D_1$ 220 has an area equal to N times that of diode $D_2$ 222. At time interval $\Delta t_1$, switches $S_1$ are closed and switches $S_2$ are opened. In this case $V_{o1}$ and $V_{o2}$ can be expressed as:

$$V_{o1} = V_T \ln \frac{I_1}{I_{s_1}} + en_1 = V_T \ln \frac{NI_2}{NI_{s_2}} + en_1 \quad (17)$$

$$V_{o2} = V_T \ln \frac{I_2}{I_{s_2}} + en_2 \quad (18)$$

Subtracting $V_{o1}$ from $V_{o2}$;

$$\Delta V_{o1} = V_{o2} - V_{o1} = V_T \ln \frac{I_2}{NI_2} \cdot \frac{NI_{s_2}}{I_{s_2}} + en_2 - en_1 \quad (19)$$

$$\Delta V_{o1} = en_2 - en_1 = \Delta e_n$$

Next, during interval $\Delta t_2$, switches $S_1$ are opened and switches $S_2$ are closed. In this situation:

$$\Delta V_{o2} = V_{o2} - V_{o1} = V_T \ln \frac{I_1}{I_{s_2}} - V_T \ln \frac{I_2}{I_{s_1}} + \Delta en \quad (20)$$

$$\Delta V_{o2} = V_T \ln \frac{I_1}{I_2} \cdot \frac{I_{s_2}}{I_{s_1}} + \Delta en$$

Since $I_1 = NI_2$ and $I_{s1} = NI_{s2}$, equation (20) can be rewritten as;

$$\Delta V_{o2} = V_T \ln N^2 + \Delta en \quad (21)$$

Subtracting $\Delta V_{o1}$ from $\Delta V_{o2}$:

$$\Delta V_o = 2V_T \ln N \quad (22)$$

Therefore, $$\frac{T}{T_o} = \frac{\Delta V_o}{2V_{T_o} \ln N} \quad (23)$$

As it can be seen from equation (23), this method eliminates the noise term, en.

2. Ratioed Area/Additional Bias Configuration

Figure 14:
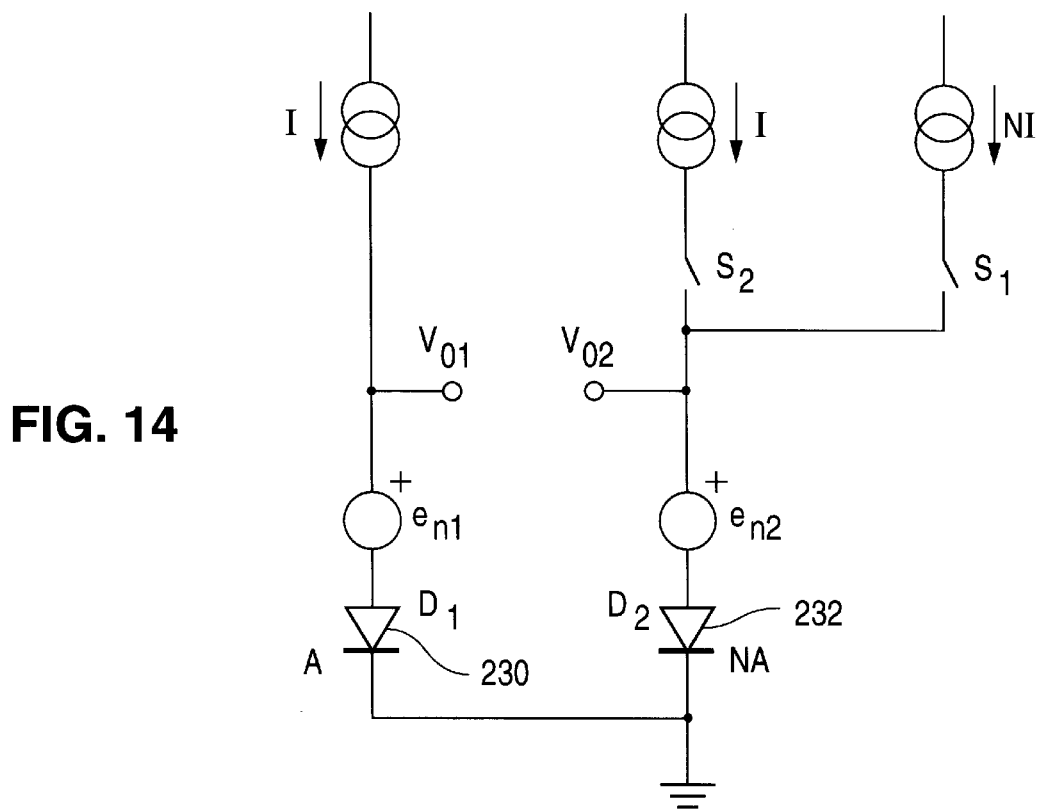

In this configuration one of the switching bias current sources is turned into a non-switching (continuous) bias. An additional auxiliary current source bias is switched in and out. As shown in FIG. 14, the bias currents $I_1$ and $I_2$ are equal, and the additional bias current is equal to N times that of $I_1$ and $I_2$. The area of diode $D_2$ 232 is N times the area of diode $D_1$ 230.

At time interval $\Delta t_1$, switch $S_1$ is closed and switch $S_2$ is opened. The $V_{o1}$ and $V_{o2}$ are expressed as;

$$V_{o1} = V_T \ln \frac{I}{I_s} + en_1 \quad (24)$$

$$V_{o2} = V_T \ln \frac{NI}{NI_s} + en_2 \quad (25)$$

Subtracting $V_{o2}$ from $V_{o1}$, $$\Delta V_{o1} = V_{o1} - V_{o2} = V_T \ln \frac{I}{I_s} \cdot \frac{NI_s}{NI} + en_1 - en_2 \quad (26)$$

$$\Delta V_{o1} = \Delta e_n$$

At time interval $\Delta t_2$, switch $S_2$ is closed and switch $S_1$ is opened. This provides;

$$\Delta V_{o2} = V_T \ln \frac{I}{I_s} + en_1 - V_T \ln \frac{I}{NI_s} - en_2 \quad (27)$$

$$\Delta V_{o2} = V_T \ln N + \Delta en$$

From equations (26) and (27), the term $\Delta en$ can be eliminated.

$$\Delta V_{o2} - \Delta V_{o1} = V_T \ln N \quad (28)$$

Equation (28) can be rewritten as:

$$\frac{T}{T_o} = \frac{\Delta V_{o2} - \Delta V_{o1}}{V_{T_o} \ln N} \quad (29)$$

3. Ratioed Bias/Double Ratioed Area Configuration

Figure 15:
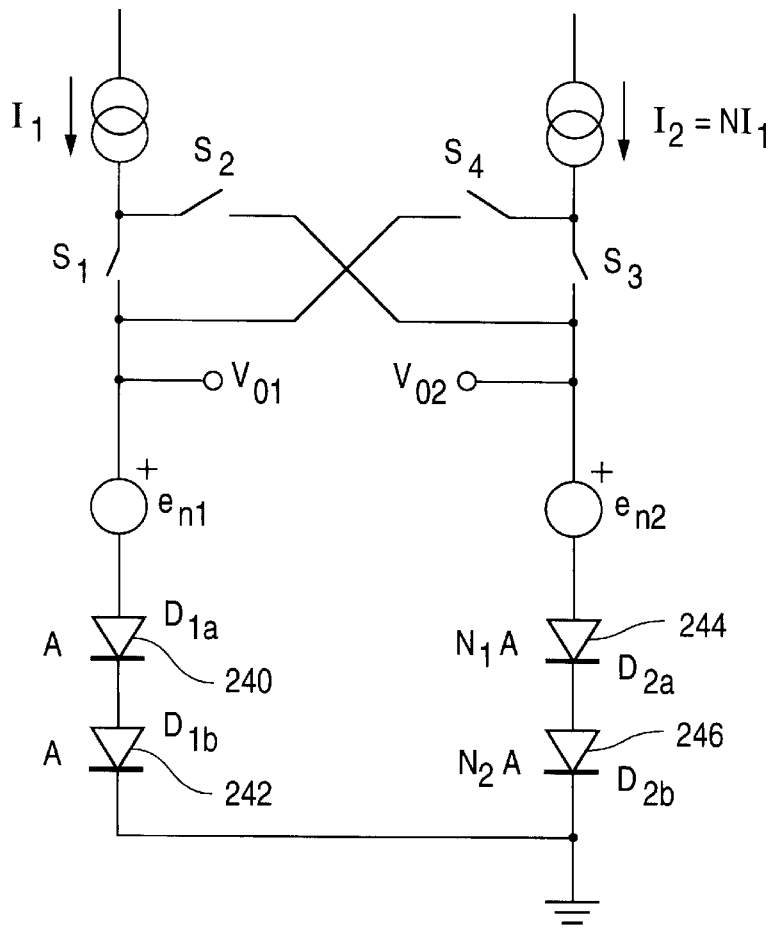

In this configuration, the bias currents are ratioed ($I_2$ is equal to N times $I_1$). A combination of two diodes connected in series (labelled "$D_{1a}$ 240" and "$D_{1b}$ 242", and "$D_{2a}$ 244" and "$D_{2b}$ 246" in the figure) is used to replace each of single diodes $D_1$ and $D_2$. The general circuit diagram is shown in FIG. 15.

At time interval $\Delta t_1$, switches $S_1$ and $S_3$ are closed, and switches $S_2$ and $S_4$ are opened. The term $\Delta V_{o1}$ can be expressed as:

$$\Delta V_{o1} = V_{o1} - V_{o2} = V_T \ln \frac{N_1 N_2}{N^2} + \Delta en \quad (30)$$

At time interval $\Delta t_2$, switches $S_2$ and $S_4$ are closed, and switches $S_1$ and $S_3$ are opened. The term $\Delta V_{o2}$ can be expressed as:

$$\Delta V_{o2} = V_T \ln (N^2 N_1 N_2) + \Delta en \quad (31)$$

From equations (30) and (31):

$$\Delta V_{o2} - \Delta V_{o1} = V_T \ln N^4 \quad (32)$$

Equation (32) can be rewritten as:

$$\frac{T}{T_o} = \frac{\Delta V_{o2} - \Delta V_{o1}}{4 V_{T_o} \ln N} \quad (33)$$

Alternatively, the signal through switch S4 may be eliminated. In this case, at time interval $\Delta t_1$, switches $S_1$ and $S_3$ are closed, and switch $S_2$ is opened. Now $\Delta V_{o1}$ is expressed as:

$$\Delta V_{o1} = V_{o1} - V_{o2} = V_T \ln \frac{N_1 N_2}{N^2} + \Delta en \quad (34)$$

At time interval $\Delta t_2$, switches $S_1$ and $S_2$ are closed, and switch $S_3$ is opened. Now $\Delta V_{o2}$ is expressed as:

$$\Delta V_{o2} = V_{o1} - V_{o2} = V_T \ln N_1 N_2 + \Delta en \quad (35)$$

From equations (35) and (34), $\Delta en$ can be eliminated.

$$\Delta V_{o2} - V_{o1} = V_T \ln N^2 \quad (36)$$

Equation (36) can be rewritten in the desired format as:

$$\frac{T}{T_o} = \frac{\Delta V_{o2} - \Delta V_{o1}}{2 V_{T_o} \ln N} \quad (37)$$

4. Ratioed Bias/Equal Area Configuration

Figure 16:
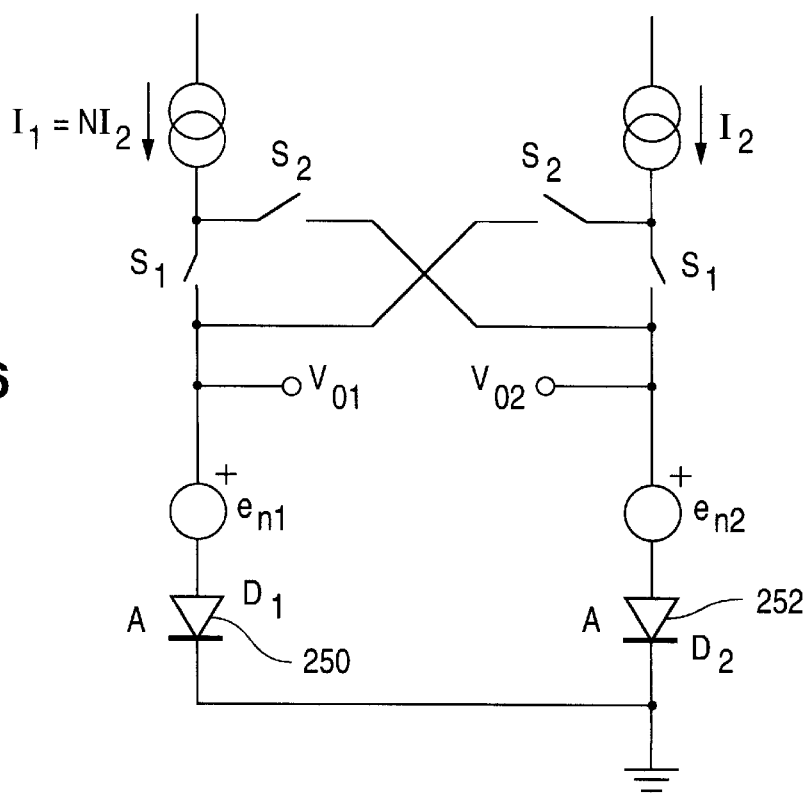

The ratioed bias/equal area configuration is shown in FIG. 16. The bias current $I_1$ is equal to N times the bias current $I_2$. The two temperature sense diodes $D_1$ 250 and $D_2$ 252 have equal areas.

At time interval $\Delta T_1$, switches $S_1$ are closed and switches $S_2$ are opened. The output voltages are expressed as:

$$V_{o1} = V_T \ln \frac{N I_2}{I_s} + en_1 \quad (38)$$

$$V_{o2} = V_T \ln \frac{I_2}{I_s} + en_2 \quad (39)$$

From equations (39) and (38), the difference $\Delta V_{o1}$ is expressed as:

$$\Delta V_{o1} = V_T \ln \left( \frac{N I_2}{I_s} \cdot \frac{I_s}{I_2} \right) + en_1 - en_2 \quad (40)$$

$$\Delta V_{o1} = V_T \ln N + \Delta en$$

At time interval $\Delta t_2$, switches $S_1$ are opened and switches $S_2$ are closed. The difference of the $V_{o1}$ and $V_{o2}$ is similarly expressed as:

$$\Delta V_{o2} = V_T \ln \frac{I_2}{I_s} + en_1 - V_T \ln \frac{N I_2}{I_s} - en_2 \quad (41)$$

$$\Delta V_{o2} = -V_T \ln N + \Delta en$$

From equations (41) and (40):

$$\Delta V_{o1} - \Delta V_{o2} = 2 V_T \ln N \quad (42)$$

As it can be seen from equation (42), the noise term $\Delta en$ is cancelled. Equation (42) can be rewritten as;

$$\frac{T}{T_o} = \frac{\Delta V_{o1} - \Delta V_{o2}}{2 V_{T_o} \ln N} \quad (43)$$

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. An apparatus for measuring the temperature of a device of interest, comprising:
   a first substrate on which is formed the device of interest;
   a temperature sensor formed on the first substrate, the temperature sensor including a first junction diode and a second junction diode; and
   a temperature sensor signal processing circuit formed on a second substrate and configured to have as an input a signal provided by the temperature sensor, wherein the temperature sensor signal processing circuit further comprises:
   a circuit operable to provide a first current level to the temperature sensor and to measure a first output voltage at an output node of the temperature sensor, and to provide a second current level to the temperature sensor and to measure a second output voltage at the output node of the temperature sensor; and a switch operable to selectively route the first current level through the first junction diode and the second current level through the second junction diode, and to selectively route the first current level through the second junction diode and the second current level through the first junction diode.

2. The temperature measuring apparatus of claim 1, wherein the temperature sensor signal processing circuit further comprises:

a differencing circuit having the first and second output voltages of the output node of the temperature sensor as inputs and operable to provide the difference between the two inputs as an output.

3. The temperature measuring apparatus of claim 1, wherein the first output voltage is measured at an ouput node of the first junction diode and the second output voltage is measured at an output node of the second juction diode.

4. The temperature measuring apparatus of claim 1, wherein the second current level is an integer multiple of the first current level.

5. The temperature measuring apparatus of claim 3, wherein the second current level is equal to the first current level, and further, wherein an area of the second junction diode is an integer multiple of an area of the first junction diode.

6. The temperature measuring apparatus of claim 3, wherein the first current level is an integer multiple of the second current level, and an area of the first junction diode is an integer multiple of an area of the second junction diode.

7. The temperature measuring apparatus of claim 6, wherein the temperature sensor signal processing circuit further comprises a circuit operable to provide a third current level to the temperature sensor and to measure a third output voltage at the output node of the temperature sensor, the third current level being an integer multiple of the second current level; and the temperature measuring apparatus further comprising:

a switch operable to selectively route either the second or third current level through the second junction diode.

8. A method of measuring the temperature of a device formed on a first substrate, comprising the steps of:

arranging a temperature sensor on the first substrate by forming a first junction diode and a second juction diode;

arranging a temperature sensor signal processing circuit on a second substrate, the signal processing circuit configured to have as an input a signal provided by the temperature sensor;

providing a first current level to the temperature sensor;

measuring a first output voltage at an output node of the temperature sensor;

providing a second current level to the temperature sensor;

measuring a second output voltage at the output node of the temperature sensor;

selectively routing either the first current level or the second current level through either the first junction diode or the second junction diode;

differencing the first and second output voltages; and determining a temperature of the device based on the difference between the first and second output voltages.

9. The method of claim 8, wherein the second current level is an integer multiple of the first current level.

10. A method of measuring the temperature of a device, the method comprising the steps of:

forming a first junction diode and a second juction diode on the device;

arranging a temperature sensor signal processing circuit configured to have as an input a signal provided by the first and second junction diodes;

providing and selectively routing a first current level through the first junction diode and a second current level through the second juction diode;

measuring a first output voltage at an output node of the first junction diode and measuring the second output voltage at an output node of the second juction diode;

selectively routing the first current level through the second juction diode and the second current level through the first junction diode; and measuring the first output voltage at the output node of the second juction diode and measuring the second output voltage at the output node of the first junction diode;

differencing the first and second output voltages; and determining a temperature of the device based on the difference between the first and second output voltages.

11. The method of claim 10, wherein the second current level is an integer multiple of the first current level.

12. The method of claim 10, wherein an area of the second juction diode is an integer multiple of an area of the first junction diode.

13. An apparatus for measuring the temperature of a device comprising:

a temperature sensor formed on the device, the temperature sensor having a first juction diode and a second junction diode; and a temperature sensor signal processing circuit formed on the device and configured to have as an input a signal provided by the temperature sensor, the temperature sensor signal processing circuit having a circuit operable to provide a first current level to the temperature sensor and to measure a first output voltage at an output node of the temperature sensor, and to provide a second current level to the temperature sensor and to measure a second output voltage at the output node of the temperature sensor; and a switch operable to selectively route the first current level through the first junction diode and the second current level through the second junction diode, and to selectively route the first current level through the second juction diode and the second current level through the first junction diode.

14. The apparatus of claim 13, wherein the first output voltage is measured at an output node of the first junction diode and the second output voltage is measured at an output node of the second junction diode.

15. The apparatus of claim 14, wherein the second current level if an integer multiple of the first current level.

16. The apparatus of claim 14, wherein the second current level is equal to the first current level, and wherein an area of the second junction diode is an integer mutliple of an area of the first junction diode.

* * * * *